United States Patent
Mignot et al.

(10) Patent No.: US 10,586,732 B2
(45) Date of Patent: Mar. 10, 2020

(54) VIA CLEANING TO REDUCE RESISTANCE

(71) Applicant: International Business Machines Corporation, Armonk, NY (US)

(72) Inventors: Yann A. M. Mignot, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 15/198,075

(22) Filed: Jun. 30, 2016

(65) Prior Publication Data
US 2018/0005874 A1    Jan. 4, 2018

(51) Int. Cl.
| | |
|---|---|
| *H01L 21/768* | (2006.01) |
| *H01L 21/02* | (2006.01) |
| *H01L 23/522* | (2006.01) |
| *H01L 23/532* | (2006.01) |

(52) U.S. Cl.
CPC .. *H01L 21/76814* (2013.01); *H01L 21/02063* (2013.01); *H01L 21/76811* (2013.01); *H01L 21/76816* (2013.01); *H01L 21/76831* (2013.01); *H01L 23/5226* (2013.01); *H01L 23/53295* (2013.01)

(58) Field of Classification Search
None
See application file for complete search history.

(56) References Cited

U.S. PATENT DOCUMENTS

| | | | |
|---|---|---|---|
| 5,702,869 A * | 12/1997 | Chien | G03F 7/36 |
| | | | 430/313 |
| 5,985,762 A | 11/1999 | Geffken et al. | |
| 6,140,236 A | 10/2000 | Restaino et al. | |
| 7,122,462 B2 | 10/2006 | Clevenger et al. | |
| 7,282,802 B2 | 10/2007 | Clevenger et al. | |
| 7,402,883 B2 | 7/2008 | Yang et al. | |
| 7,528,066 B2 | 5/2009 | Yang et al. | |
| 7,867,895 B2 | 1/2011 | Yang et al. | |
| 7,892,968 B2 | 2/2011 | Chen et al. | |
| 8,232,196 B2 | 7/2012 | Yang et al. | |
| 8,835,305 B2 | 9/2014 | Yang et al. | |
| 2005/0064698 A1 * | 3/2005 | Chang | H01L 21/02126 |
| | | | 438/623 |
| 2005/0153538 A1 * | 7/2005 | Tsai | H01L 21/31116 |
| | | | 438/636 |
| 2007/0202689 A1 | 8/2007 | Choi et al. | |
| 2008/0156636 A1 | 7/2008 | Petrarca et al. | |
| 2008/0242082 A1 | 10/2008 | Yang et al. | |
| 2012/0199976 A1 | 8/2012 | Yang et al. | |
| 2013/0134491 A1 * | 5/2013 | Messenger | H01L 21/84 |
| | | | 257/301 |

* cited by examiner

*Primary Examiner* — Hrayr A Sayadian
(74) *Attorney, Agent, or Firm* — Vazken Alexanian; Ryan, Mason & Lewis, LLP

(57) ABSTRACT

A method includes forming at least a first via in a multilayer structure comprising a first layer and a second layer formed over the first layer, the first via extending from a top of the second layer to a top of a first contact formed in the first layer and forming a polymer film on at least a portion of sidewalls of the first via by etching the top of the first contact using a cleaning process.

19 Claims, 14 Drawing Sheets

750

250

220-1

275

220-2

300

350

375

400

500

550

575

501

503

108

122

600

650

750

775

800

850

875

900

950

975

VIA CLEANING TO REDUCE RESISTANCE

BACKGROUND

The present application relates to vias and trenches, and more specifically, to techniques for forming vias and/or trenches. Vias and trenches are often used to interconnect components in electronic structures, such as integrated circuits, semiconductor structures, etc. Vias and trenches may also be used to facilitate bonding different layers to one another in electronic and other structures.

SUMMARY

Embodiments of the invention provide techniques for via cleaning to lower resistance and protect critical dimensions of vias.

For example, in one embodiment a method comprises forming at least a first via in a multilayer structure comprising a first layer and a second layer formed over the first layer, the first via extending from a top of the second layer to a top of a first contact formed in the first layer, and forming a polymer film on at least a portion of sidewalls of the first via by etching the top of the first contact using a cleaning process.

DETAILED DESCRIPTION

Figure 1A:
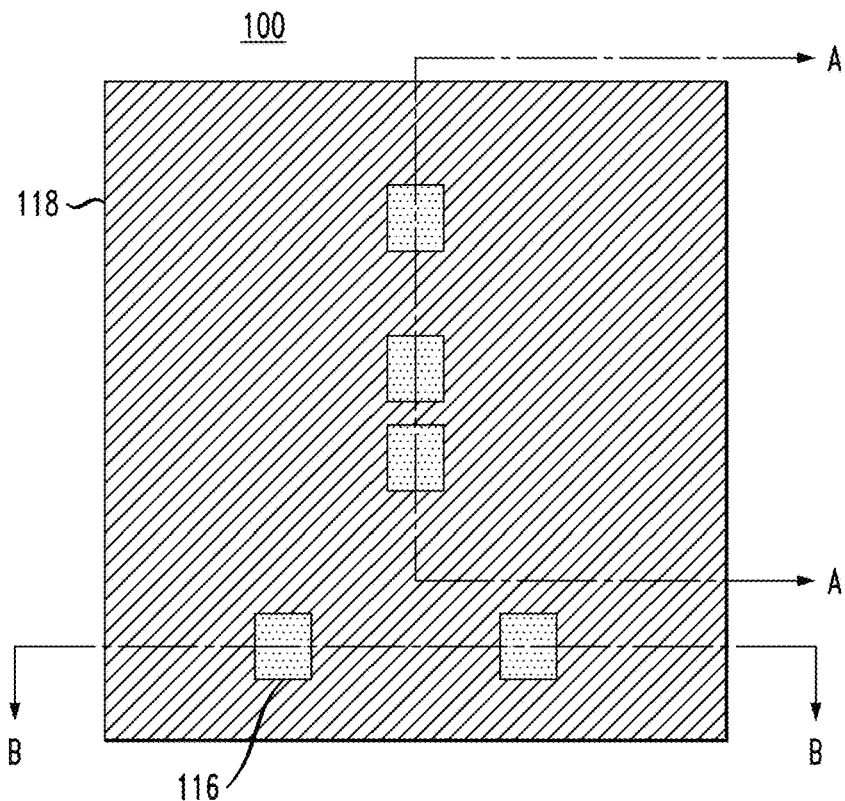
FIG. 1A depicts a top view of a multilayer structure, according to an embodiment of the invention.

Illustrative embodiments of the invention may be described herein in the context of illustrative methods for via cleaning to lower resistance, as well as illustrative apparatus, systems and devices having trenches and/or vias cleaned to lower resistance. However, it is to be understood that embodiments of the invention are not limited to the illustrative methods, apparatus, systems and devices but instead are more broadly applicable to other suitable methods, apparatus, systems and devices.

As mentioned above, vias and trenches are used for a variety of purposes in electronic structures. Damascene techniques, for example, may be used to form interconnects in semiconductor integrated circuits and other devices. Damascene techniques generally utilize an interlevel dielectric layer, having openings formed therein which are overfilled with a metal such as copper (Cu), with excess metal being removed using chemical mechanical polishing (CMP). Multiple interlevel dielectric layers may be used to form an overall interconnect structure with multiple wiring levels. Openings formed in the interlevel dielectric layer, which may be trenches or vias, may be used to form a pattern of wires or lines used to route signals from different locations in an integrated circuit. Openings for the wires or lines may extend only partially through an interlevel dielectric layer, relative to its top surface. In dual damascene techniques, some openings are formed entirely through an interlevel dielectric layer to a contact below. This advantageously permits vias (e.g., openings formed entirely through the interlevel dielectric layer) to be in communication with trenches (e.g., openings that only extend partially through the interlevel dielectric layer). The vias and trenches may be filled simultaneously.

Generally, it is desired to form vias and trenches having low resistance. This may be achieved in part by using larger channel dimensions, e.g., wider trenches or vias as the height is mostly fixed. Larger vias and trenches, however, can affect the chamfering angle and increase the overall size required for a device. Embodiments provide advantages in forming trenches and vias with low via resistance and a high chamfering angle without necessitating increasing channel dimensions. A chamfer angle may normally be in the range of 30 to 50 degrees. Using the via cleaning techniques described herein, this angle may be improved by 10 degrees or more, up to a maximum of 90 degrees. The via resistance may be reduced by 20% or more.

In some embodiments, a cleaning process such as an argon (Ar) cleaning is performed at the metallization level to enable a better via connection to the metals below, such as contacts for an integrated circuit or other electronic structure. This cleaning process may be used in semiconductor fabrication using a trench first metal hard mask (TFMHM) process, or in a via first with organic polymer layer (OPL) plug process. An example TFMHM process will be described in detail below with respect to FIGS. 1-9. Advantageously, utilizing the cleaning process described an OPL is opened to facilitate formation of vias while covering a remainder of the structure, thus avoiding additional damage or degradation to a dielectric layer while performing the clean. In via first OPL plug processes, two main etches are used—a first via opening, followed by OPL refill ex situ, and then back to etch for trenches. The cleaning process described herein with respect to the TFMHM process of FIGS. 1-9 may also be used to provide benefits for the via first OPL plug process, as the cleaning process may be performed in situ post via etching and before the first OPL pull.

Embodiments can provide various advantages facilitating fabrication of trenches and vias in semiconductor and other electronic structures. For example, via cleaning can be done in situ during a reactive-ion etching (RIE) rather than ex situ after the RIE. The via cleaning does not need to break through a liner, and does not present a trench risk of critical dimension (CD) or depth increases. In addition, the via cleaning provides improvements to the chamfering profile.

A via cleaning step may be performed in some embodiments to gauge a bottom contact and create a polymerizing film around vias to delay or prevent CD erosion or degradation in subsequent processing steps, such as an OPL strip which may damage an interlevel dielectric layer or the CD of vias formed in the interlevel dielectric layer. Via cleaning may be performed while the OPL is still in place to prevent any damage of trench connections, while the organic material facilitates build-up of the polymer film.

In some embodiments, a method comprises forming at least a first via in a multilayer structure comprising a first layer and a second layer formed over the first layer, the first via extending from a top of the second layer to a top of a first contact formed in the first layer, and forming a polymer film on at least a portion of sidewalls of the first via by etching the top of the first contact using a cleaning process. The cleaning process may be an in situ RIE. The cleaning or sputtering process may utilize Ar gas, a combination of Ar and helium (He) gases or other suitable inert gases or combinations thereof. A combination of Ar and He may have <2% He or approximately 2 to 10% He. The cleaning process may utilize a total flow of inert gases from 200 to 1200 standard cubic centimeters per minute (sccm), or in some cases a flow exceeding 1200 sccm. The cleaning process may utilize a radio frequency (RF) powered magnetic field of at least 200 watts.

Via cleaning in situ during a RIE may be used to shape previously-defined vias by creating an outside cylinder of polymers on the sidewall of the vias.

In some embodiments, multiple vias are formed in the multilayer structure, with a trench being formed that connects two or more vias together. For example, a first via and a second via may be formed in the multilayer structure with each of the first via and second via extending from the top of the second layer to respective contacts formed in the first layer. A first trench may be formed partway through the second layer to connect the first via and the second via. Thus, the first via, second via and first trench form a chamfer. The polymer film may be formed on sidewalls of both the first and second via, such that the dimensions of the chamfer are protected during subsequent processing steps. For example, the chamfer may have an angle of 40 to 80 degrees or higher, as the via dimensions are protected by the polymer film formed on sidewalls thereof.

The polymer film formed on at least a portion of the sidewalls of the first via may comprise an oxide formed by the Ar used in the via cleaning interacting with the second layer, which may be a dielectric layer. The polymer film is thin, e.g., on the range of 1 to 3 nanometers (nm) in some embodiments. The second layer, as mentioned, may be a dielectric layer while the first layer is a silicon substrate and the first contact is a metal contact. In some embodiments, the dielectric layer is an ultra low-K (ULK) dielectric layer such as silicon oxide, fluorinated silicon oxide (SiOF). Other low-k materials may also be used for the dielectric layer in some embodiments, including but not limited to hydrogenated silicon oxycarbide (H:SiOC) and porous H:SiOC materials. The metal contact may be, for example, Cu, aluminum (Al), tungsten (W), etc.

In some embodiments, the multilayer structure includes a third layer formed over the second layer. The third layer may be an OPL or organic dielectric layer (ODL). Forming the first via in the multilayer structure may thus include forming an opening from a top surface of the third layer to a bottom surface of the third layer using a chemical etch and a resist mask, and forming the first via by etching the second layer through the opening provided by the via formed in the third layer. The cleaning process causes formation of the polymer film on at least a portion of the sidewalls of the first via. The polymer film is not necessarily formed on the entire sidewalls of the first via. For example, the height of the polymer film (from the top of the first contact in the first layer) may only be formed partway through the second layer. The height of the polymer film may be a function of the length and type of cleaning used in the in situ RIE.

The third layer may be stripped from the multilayer structure after the via cleaning. The polymer film formed during the via cleaning protects the CD of the first via during stripping of the third layer.

The above-described method may be used to form a semiconductor structure or an integrated circuit. Such a semiconductor structure or integrated circuit may include a multilayer structure comprising a first layer and a second layer formed over the first layer, at least a first via extending from a top of the second layer to a top of a contact formed in the first layer, and a polymer film on at least a portion of sidewalls of the first via, the polymer film being formed by etching the top of the first contact using a cleaning process. In some embodiments, the apparatus or integrated circuit includes a second via extending from the top of the second layer to a second contact formed in the first layer, as well as a first trench connecting the first via and the second via. The first via, second via and first trench form a chamfer with a high chamfering angle.

Figure 1B:
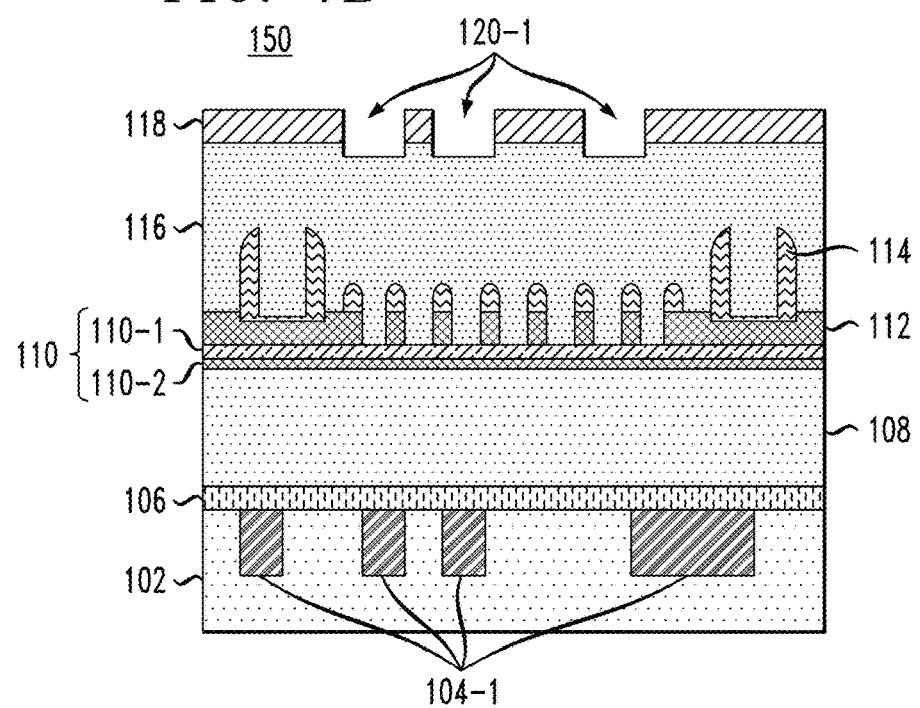
FIG. 1B depicts a first side cross-sectional view of the FIG. 1A structure, according to an embodiment of the invention.
Figure 1C:
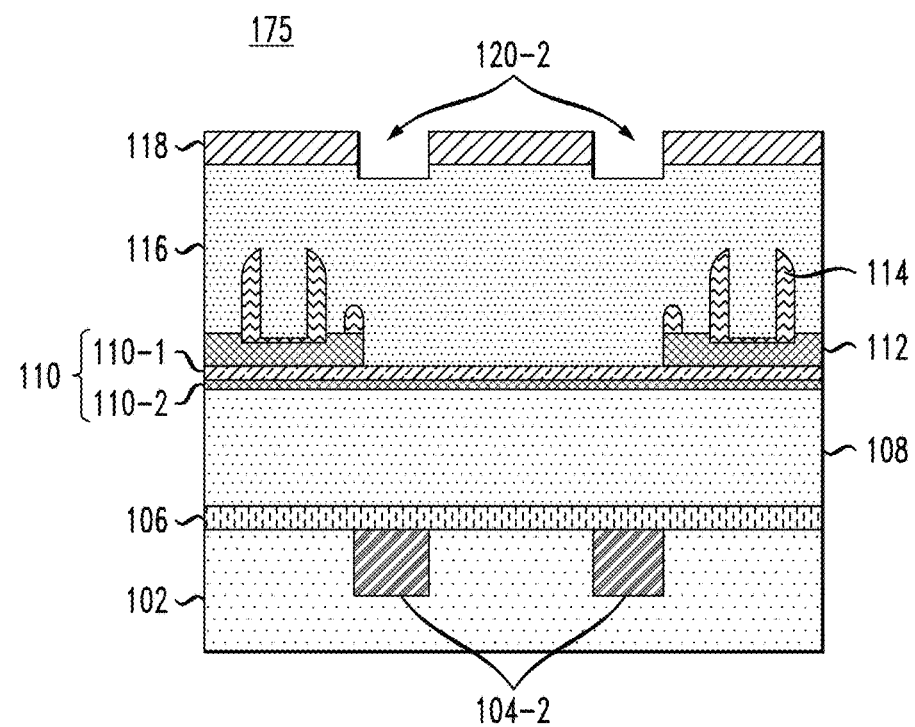
FIG. 1C depicts a second side cross-sectional view of the FIG. 1A structure, according to an embodiment of the invention.

The figures described below show a process for via cleaning. FIG. 1A shows a top-down view 100, FIG. 1B shows a first side cross-sectional view 150 taken along the line A-A in FIG. 1A and FIG. 1C shows a second side cross-sectional view 175 taken along the line B-B in FIG. 1A. The view 150 taken along line A-A in FIG. 1A and other views taken along the line A-A in FIGS. 2A, 3A, 4A, 5A, 6A, 7A, 8A and 9A are also referred to herein as views taken in the self-aligned via (SAV) direction, while the view 175 taken along line B-B in FIG. 1A and other views taken along the line B-B in FIGS. 2A, 3A, 4A, 5A, 6A, 7A, 8A and 9A are also referred to herein as views taken in the non-SAV direction.

FIGS. 1A, 1B and 1C show a multilayer structure, including substrate 102, contacts 104-1 and 104-2 collectively referred to herein as contacts 104, capping layer 106, dielectric layer 108, first oxide layer 110-1 and second oxide layer 110-2 collectively referred to herein as oxide layer 110, nitride layer 112, mask oxide layer 114, organic layer 116 and coating layer 118 having openings 120-1 and 120-2 collectively referred to herein as openings 120 formed therein.

The substrate 102 may be a wafer, panel, roll, etc. The substrate 102 may be an oxide on top of a silicon substrate, although other suitable materials such as silicon on insulator (SOI) or silicon germanium (SiGe) substrates, etc. may be used. Thickness of the substrate 102 ranges from 100 nm to a few microns in some embodiments.

The contacts 104 may be metal contacts, formed of materials such as W, Cu, ruthenium (Ru), etc. Although FIG. 1 shows a specific via formed in the SAV direction (e.g., a via to contact 104-1) and a specific via formed in the non-SAV direction (e.g., a via to contact 104-2) this is merely an example as each single via may be considered as in the SAV or non-SAV direction based on the cleave direction A-A or B-B. The contacts 104 may also vary in size, as illustrated in FIGS. 1B and 1C. As an example, contacts 104 may have a height ranging from 20 to 200 nm, and width ranging from sub 18 nm to more than 64 nm in some embodiments.

The capping layer 106 may be formed of an NBLOK material ($Si_wC_xN_yH_z$), which has a higher dielectric constant relative to a BLOK compound ($Si_aC_bN_cH_d$). NBLOK has more nitrogen (N) relative to BLOK (e.g., about 10 mol % to 25 mol %), thus providing a higher dielectric constant. The use of NBLOK provides a good oxygen barrier and a good copper barrier. Other examples of materials which may be used for the capping layer 106 include a nitride or oxide material such as silicon nitride ($Si_xN_x$), silicon carbon nitride (SiCN), silicon oxynitride (SiON), aluminum nitride ($Al_xN_y$), or any other suitable material including an insulator material. The capping layer 106 may be approximately 5 to 30 nm thick in some embodiments.

The dielectric layer 108 may be an ULK dielectric layer, such as H:SiOC and porous H:SiOC materials. The dielectric layer 108 may be approximately from 40 to 200 nm thick.

Oxide layer 110 may include first oxide layer 110-1 and second oxide layer 110-2. In some embodiments, the first oxide layer 110-1 may be formed of tetraethyl orthosilicate (TEOS) while the second oxide layer 110-2 is formed of SiN or another nitride film, or vice versa. Each of the first oxide layer 110-1 and second oxide layer 110-2 may range in thickness from 5 to 15 nm in some embodiments. The use of two oxide layers 110-1 and 110-2 helps during removal of the nitride layer 112 and subsequent metal filling by avoiding the pinch of and reducing the lateral bowing of the dielectric layer 108.

The nitride layer 112 may be a metal layer such as titanium nitride (TiN), tantalum nitride (TaN), etc. The nitride layer 112 is a hard mask (HM), approximately 15 to 30 nm thick in some embodiments. The particular pattern of the nitride layer 112 depends on the interconnections that will be formed in a resulting structure.

The mask oxide layer 114, as shown, is the previous hard mask oxide (HMO) used to define the trenches in nitride layer 112. The mask oxide layer 114 may be used for sidewall image transfer (SIT) patterning or self-aligned double patterning (SADP) processing. FIGS. 1B and 1C show an example of SIT or SADP patterning. The mask oxide layer 114 may be approximately 40 to 120 nm thick in some embodiments, and may be formed of an oxide spacer.

The organic layer 116 may be an OPL or ODL formed of an organic planarization material. The organic layer 116 may be approximately 60 to 200 nm thick in some embodiments.

Coating layer 118 may be a silicon antireflective coating (SIARC) layer. The coating layer 118 may be approximately 10 to 35 nm thick in some embodiments. Openings 120 may be formed using a resist mask not shown in FIG. 1. For example, the openings 120 may be formed using a SIARC RIE using difluoromethane ($CH_2F_2$) and tetrafluoromethane ($CF_4$), which may be diluted with Ar.

The sizes of openings 120 may vary depending on the size of the contacts below, but are generally in the range of 24 by 32 nm in case of extreme ultraviolet (EUV) lithography or in the range of 40 by 60 nm in the case of optical lithography. In the SAV direction, openings 120-1 are defined or named at locations in which vias will be formed to contact respective ones of the contacts 104-1.

Figure 2A:
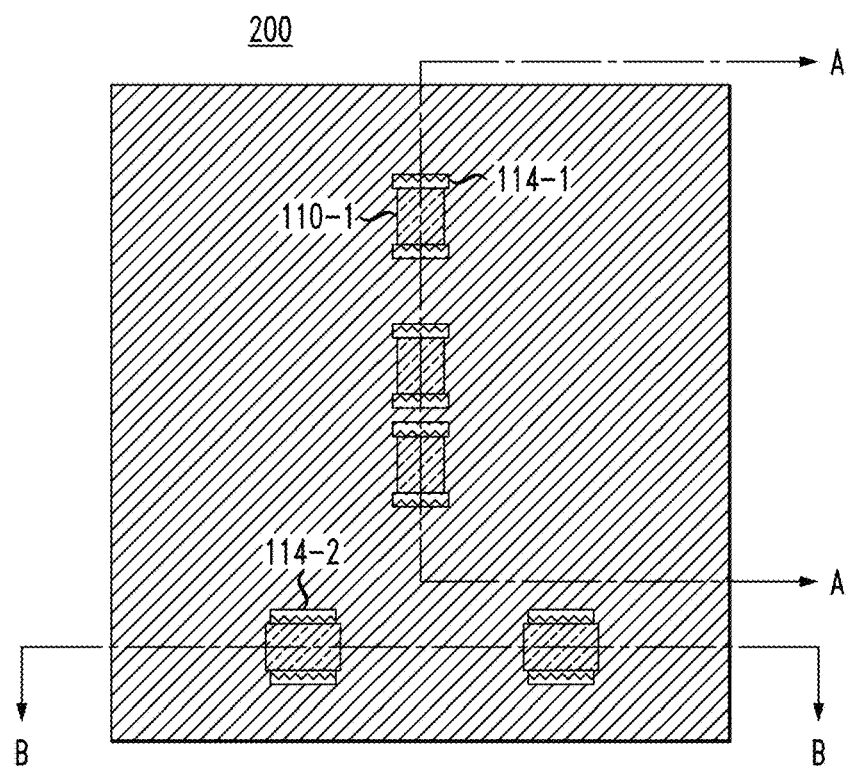
FIG. 2A depicts a top view of the FIG. 1A structure following formation of vias to open an organic layer to a bottom oxide layer, according to an embodiment of the invention.
Figure 2B:
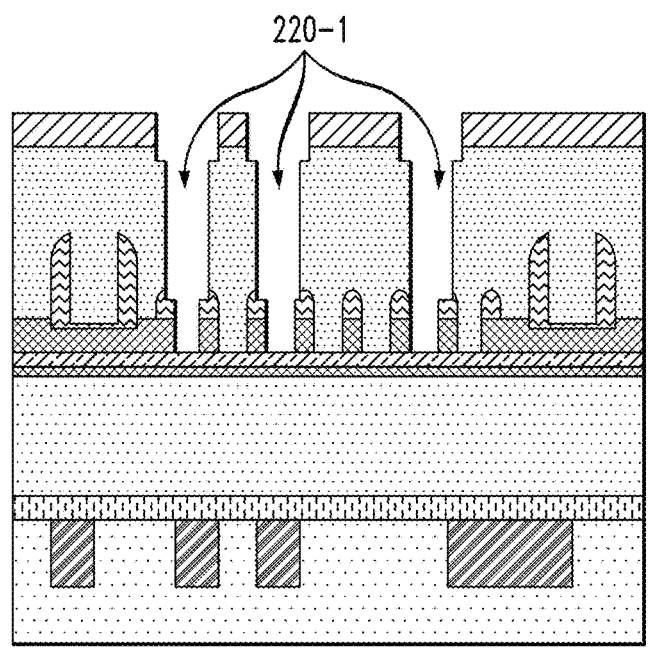
FIG. 2B depicts a first side cross-sectional view of the FIG. 2A structure, according to an embodiment of the invention.
Figure 2C:
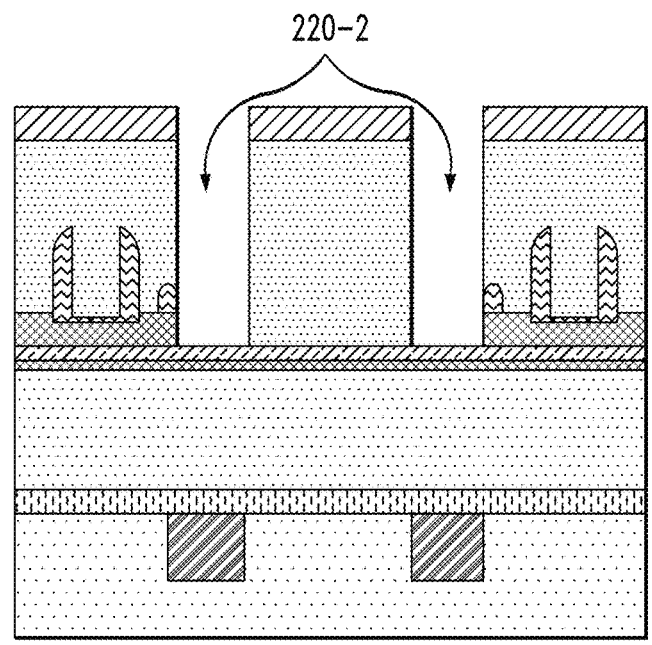
FIG. 2C depicts a second side cross-sectional view of the FIG. 2A structure, according to an embodiment of the invention.

FIG. 2A shows a top view 200 of the FIG. 1A structure following formation of vias 220-1 and 220-2 to open the organic layer 116 to the oxide layer 110-1. FIG. 2B shows a side cross-sectional view 250 taken along the line A-A in FIG. 2A. FIG. 2C shows a side cross-sectional view 275 taken along the line B-B in FIG. 2A. Etches are used to open the organic layer 118 in the areas exposed by openings 120 so as to form vias 220-1 in the SAV direction and vias 220-2 in the non-SAV direction. Various chemistries may be used to open the organic layer 116 and coating layer 118. The coating layer 118, for example, may be opened with a fluoride based chemistry and the organic layer 116 may be opened using nitrogen or hydrogen mixtures ($N_2/H_2$), carbon monoxide and carbon dioxide mixtures ($CO/CO_2$), mixtures of hydrobromic acid and helium (HBr/He), etc. with possible additions of carbonyl sulfide (COS), oxygen ($O_2$), etc.

Figure 3A:
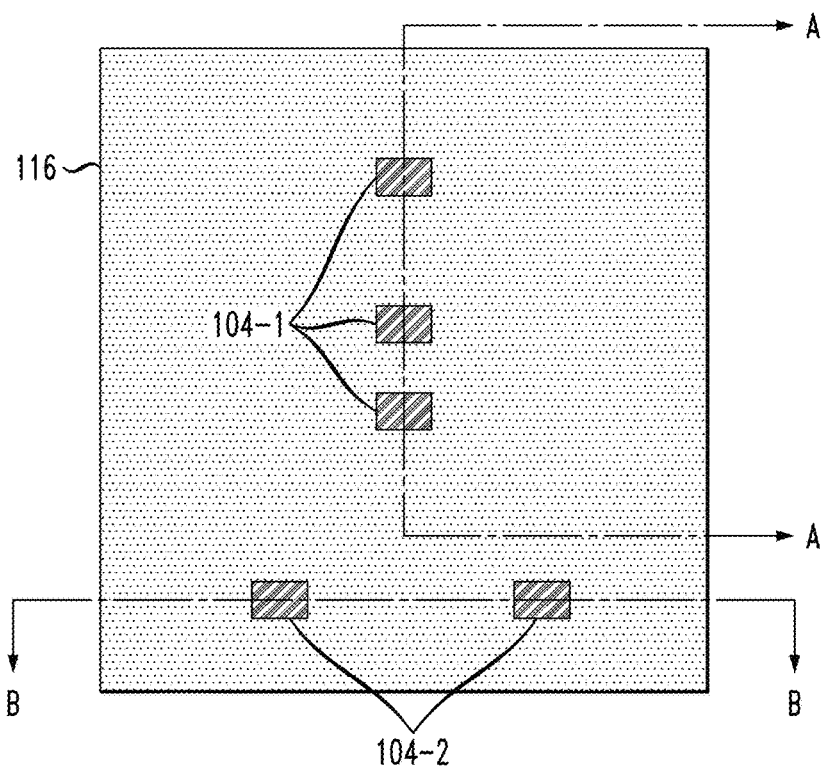
FIG. 3A depicts a top view of the FIG. 2A structure following formation of vias through a dielectric layer using the via openings formed in the organic layer, according to an embodiment of the present invention.
Figure 3B:
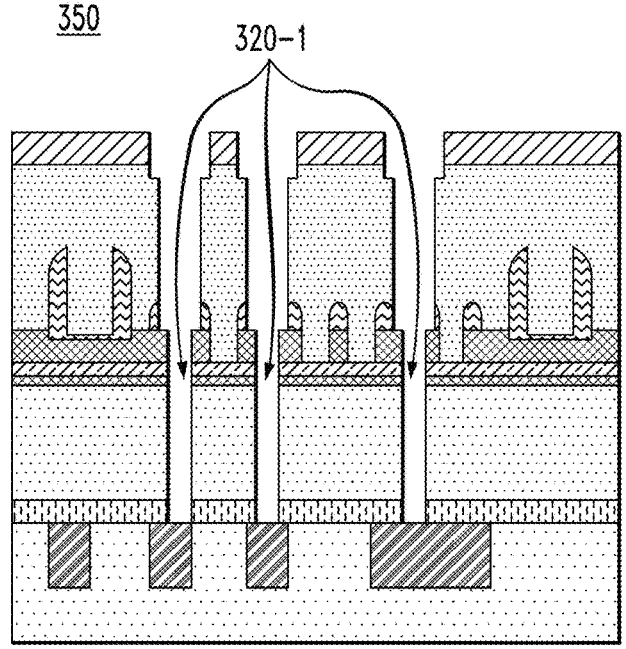
FIG. 3B depicts a first side cross-sectional view of the FIG. 3A structure, according to an embodiment of the invention.
Figure 3C:
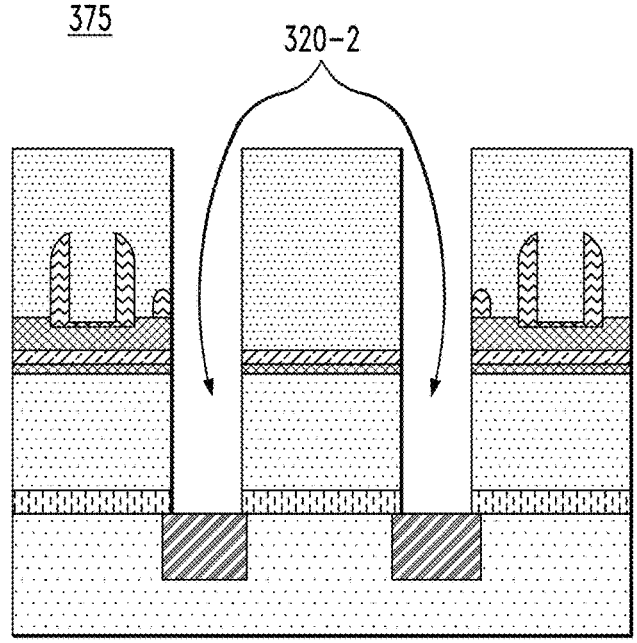
FIG. 3C depicts a second side cross-sectional view of the FIG. 3A structure, according to an embodiment of the invention.

FIG. 3A shows a top view 300 of the FIG. 2A structure following formation of vias 320-1 and 320-2 through dielectric layer 108 using the openings of vias 220-1 and 220-2, respectively, formed in the organic layer 116. FIG. 3B shows a side cross-sectional view 350 taken along the line A-A in FIG. 3A. FIG. 3C shows a side cross-sectional view 375 taken along the line B-B in FIG. 3A. The processing illustrated in FIGS. 3A, 3B and 3C may proceed in two steps. In a first step the top mask (e.g., oxide layer 110) and the dielectric layer 108 are etched using the openings of vias 220-1 and 220-2 formed in organic layer 116. The coating layer 118 is removed at the same time that the oxide layer 110 and dielectric layer 108 are etched. The chemistry used in some embodiments is a fluoride based etch such as $CF_4$, octafluorocyclobutane ($C_4F_8$), $CH_2F_2$ with hydrogen ($H_2$) and nitrogen ($N_2$) and Ar, etc. In the second step, the capping layer 106 is opened. A different etch chemistry may be used to open the capping layer 106. For example, $CF_4$ may be used, possibly with traces of Ar and nitrogen trifluoride ($NF_3$).

Figure 4A:
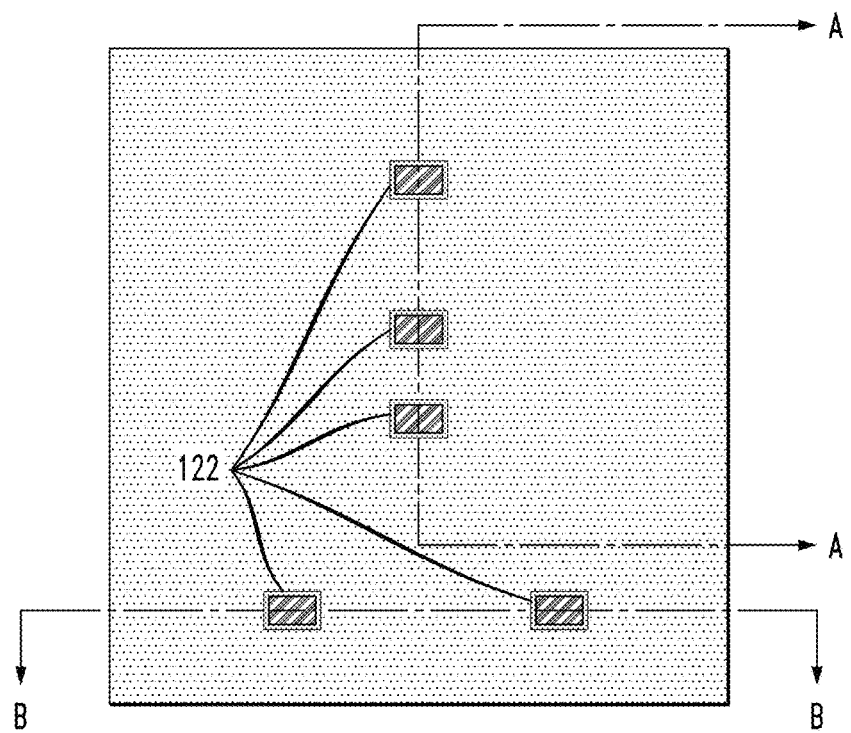
FIG. 4A depicts a top view of the FIG. 3A structure following via cleaning sequence and formation of a polymer film on sidewalls of the vias in the dielectric layer, according to an embodiment of the invention.
Figure 4B:
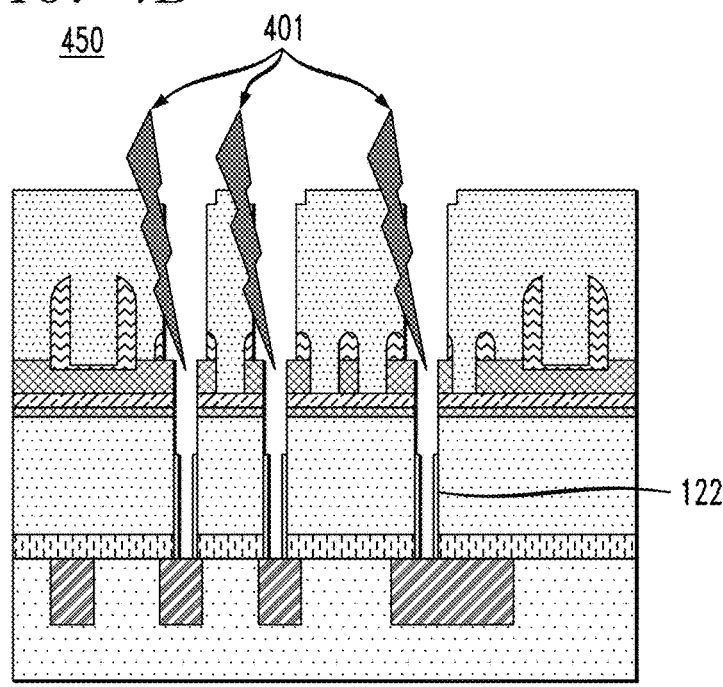
FIG. 4B depicts a first side cross-sectional view of the FIG. 4A structure, according to an embodiment of the invention.
Figure 4C:
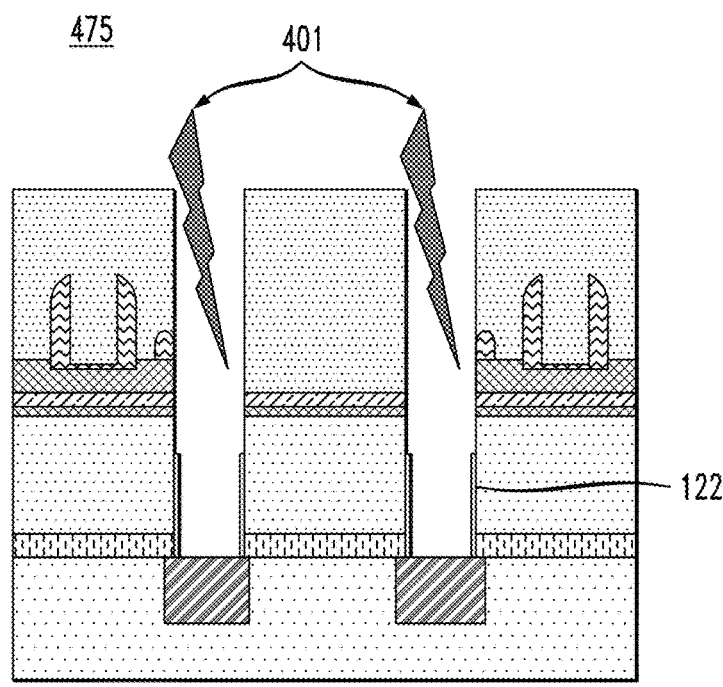
FIG. 4C depicts a second side cross-sectional view of the FIG. 4A structure, according to an embodiment of the invention.

FIG. 4A shows a top view 400 of the FIG. 3A structure following formation of a polymer film 122 on sidewalls of the vias 320-1 and 320-2 in dielectric layer 108. FIG. 4B shows a side cross-sectional view 450 taken along the line A-A in FIG. 4A. FIG. 4C shows a side cross-sectional view 475 taken along the line B-B in FIG. 4A. The polymer film 122 is formed during a cleaning process 401 of the vias 320-1 and 320-2. In some embodiments, the cleaning process 401 also lowers a resistance of vias 320-1 and 320-2. The cleaning in some embodiments includes a high flow of Ar or Ar/He. A high flow may be, for example, 1200 sccm. As mentioned above, the cleaning process may use Ar alone or a mixture of Ar and He. Such a mixture of Ar and He may contain only a small amount of He, such as less than 2% He. The cleaning process may utilize a high power such as approximately 200 W or greater or 300 W or greater. The cleaning process may also utilize a high bias from a range of 50 to 400 V to facilitate a physical effect at the bottom of the vias.

The polymer film 122 may be an oxide layer. The polymer film 122 results from the combination of the damaged ULK or other dielectric in layer 108 on the sides of the vias 320-1 and 320-2 generated during the via opening and the cleaning of the bottom of the vias 320-1 and 320-2 with the reaction of the capping layer 108 and bottom metal layer of the contacts 104-1 and 104-2. The polymer film 122 may have a thickness ranging from 1 to 3 nm in some embodiments.

As shown in view 400, the polymer film is formed on all the sidewalls of the vias formed through openings 120. As shown in views 450 and 475, however, the polymer film 122 has a height that is less than that of the dielectric layer 108. The exact height of the polymer film 122 may be modulated by adjusting the cleaning process. For example, a longer cleaning process or a cleaning process with higher flow and/or power may increase the height and/or the thickness of polymer film 122. In some embodiments the polymer film 122 may be formed such that it is on sidewalls of the vias from the top to the bottom of the dielectric layer 108. More generally, it is desired in some embodiments to form the height of the polymer film 122 such that it is at least as high in the dielectric layer 108 as bottom walls of trenches to be formed in the structure as described below with respect to FIGS. 6A, 6B, 6C, 7A, 7B and 7C.

Figure 5A:
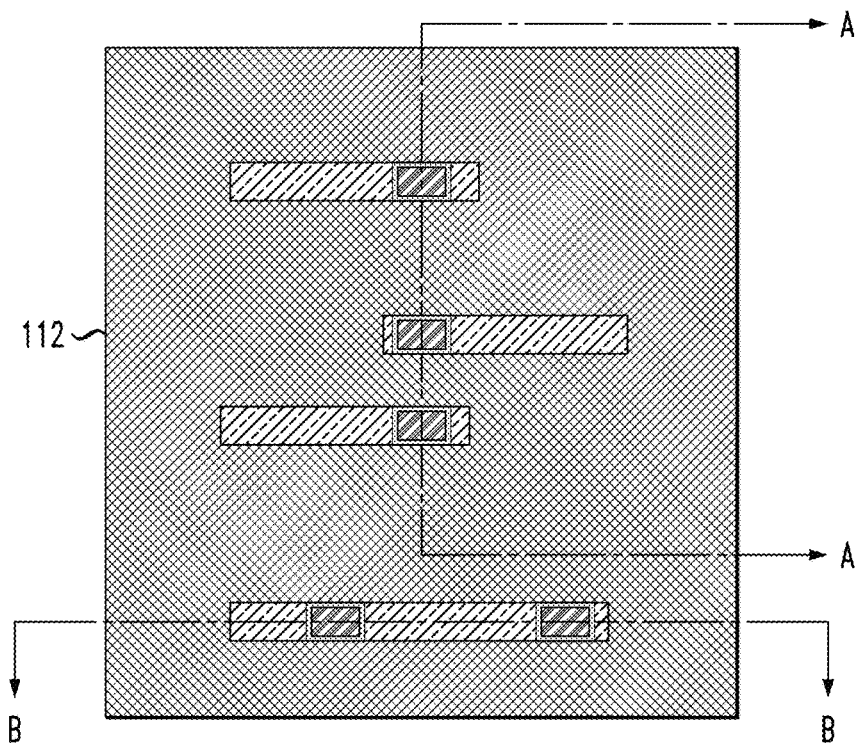
FIG. 5A depicts a top view of the FIG. 4A structure following removal of the organic layer, according to an embodiment of the invention.
Figure 5B:
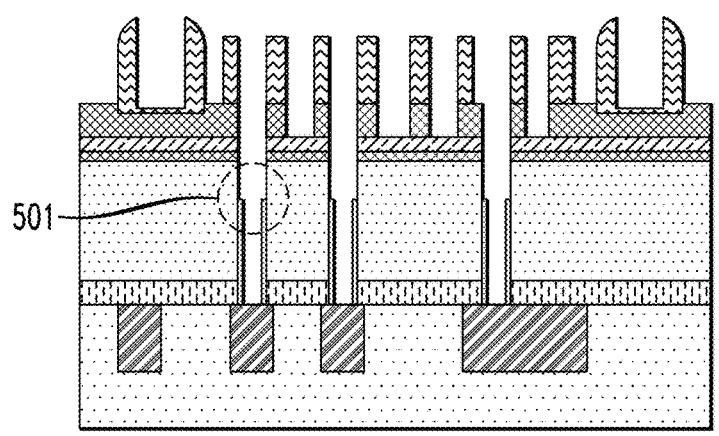
FIG. 5B depicts a first side cross-sectional view of the FIG. 5A structure, according to an embodiment of the invention.
Figure 5C:
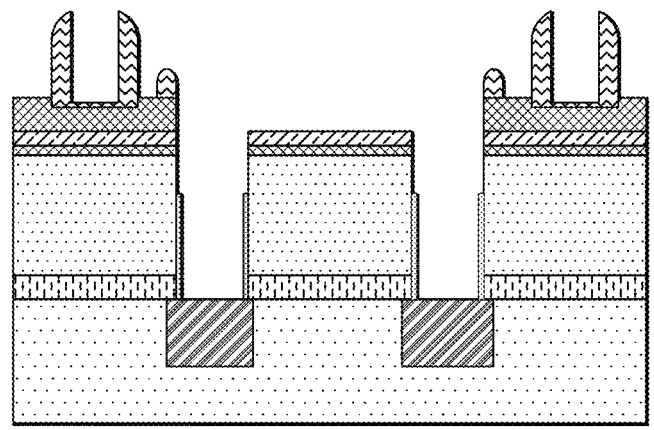
FIG. 5C depicts a second side cross-sectional view of the FIG. 5A structure, according to an embodiment of the invention.
Figure 5D:
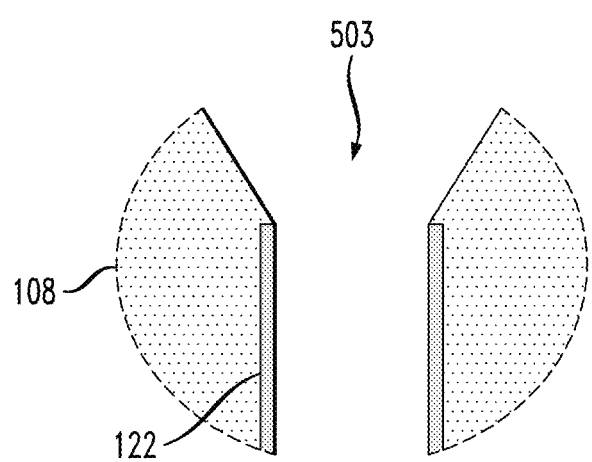
FIG. 5D depicts a close-up view of a portion of FIG. 5B, according to an embodiment of the invention.

FIG. 5A shows a top view 500 of the FIG. 4A structure following removal of organic layer 116. FIG. 5B shows a side cross-sectional view 550 taken along the line A-A in FIG. 5A. FIG. 5C shows a side cross-sectional view 575 taken along the line B-B in FIG. 5A. FIG. 5D shows a close up view of portion 501 in FIG. 5B. The organic layer 116 may be stripped by $CO/CO_2$ and/or $N_2H_2$ to avoid extra damage to the ULK dielectric layer 108 or carbon depletion. The polymer film 122 formed on sidewalls of the vias protects the CD of the vias during this stripping process. FIG. 5D illustrates this protection in the close-up view 501. As shown, the polymer film 122 maintains the dimensions of the via shown, while the dielectric layer 108 not covered by polymer film 122 experiences degradation 503 as shown. It is important to note that FIG. 5D, and the other figures described herein, are not necessarily shown to scale. For example, the close-up view 501 in FIG. 5D exaggerates the degradation 503 for clarity of illustration.

Figure 6A:
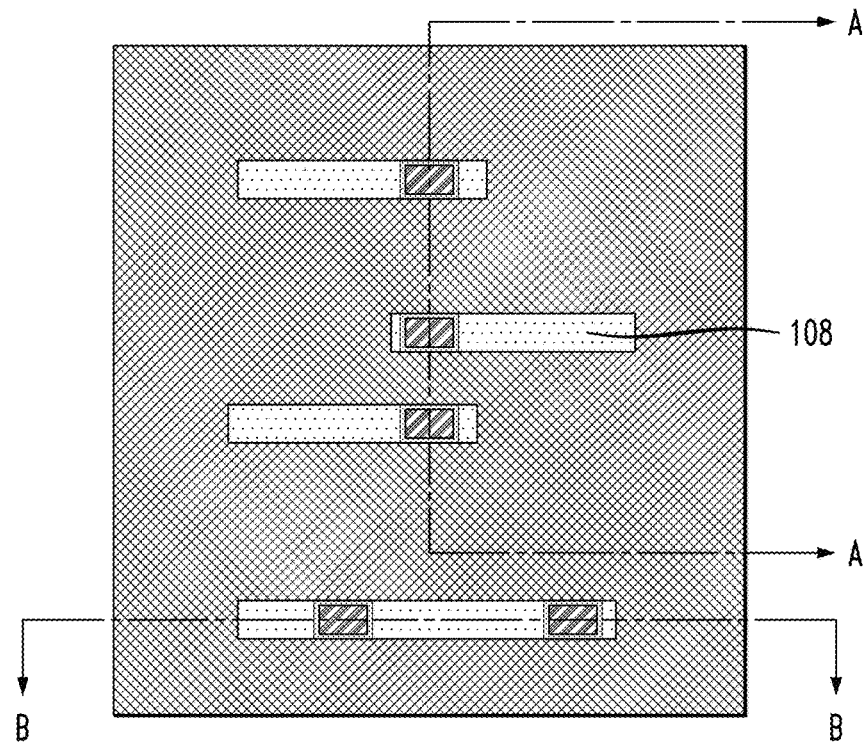
FIG. 6A depicts a top view of the FIG. 5A structure following removal of the mask oxide and formation of trenches in the dielectric layer, according to an embodiment of the present invention.
Figure 6B:
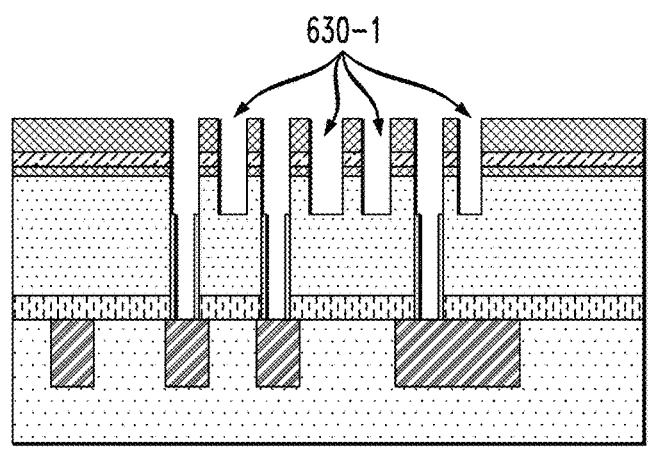
FIG. 6B depicts a first side cross-sectional view of the FIG. 6A structure, according to an embodiment of the invention.
Figure 6C:
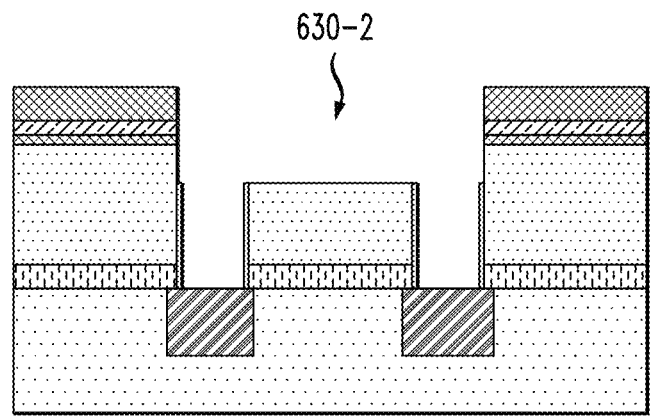
FIG. 6C depicts a second side cross-sectional view of the FIG. 6A structure, according to an embodiment of the invention.

FIG. 6A shows a top view 600 of the FIG. 5A structure following removal of the mask oxide 114 and formation of trenches 630-1 and 630-2 in the dielectric layer 108. FIG. 6B shows a side cross-sectional view 650 taken along the line A-A in FIG. 6A. FIG. 6C shows a side cross-sectional view 675 taken along the line B-B in FIG. 6A. As shown, trenches 630-1 are formed in the SAV direction as patterned by the openings in mask oxide 114. Trench 630-2 is formed in the non-SAV direction. The trenches 630-1 and 630-2 are not shown in FIG. 6A for clarity of illustration.

The trench 630-2 connects or bridges the vias 320-2 formed in the non-SAV direction. As shown in FIG. 6C, the bridge connecting trench 630-2 and vias 320-2 skips over one or more of the contacts 104-2 formed in substrate 102, permitting greater flexibility in forming interconnections in the resulting structure. While FIG. 6C shows an example wherein the bridge skips one contact, similar bridges may be formed to skip over multiple contacts on other portions of a structure in the non-SAV direction. The vias 320-2 and trench 630-2 form a chamfer with a high chamfering angle. The polymer film 122, as discussed above, protects the CD of the vias 320-2, such that the chamfer formed by vias 320-2 and trench 630-2 is squared (e.g., the edges form substantially right angles) rather than a V or W shape. Increasing the chamfer angle provides various benefits, include avoiding unwanted shorts.

Figure 7A:
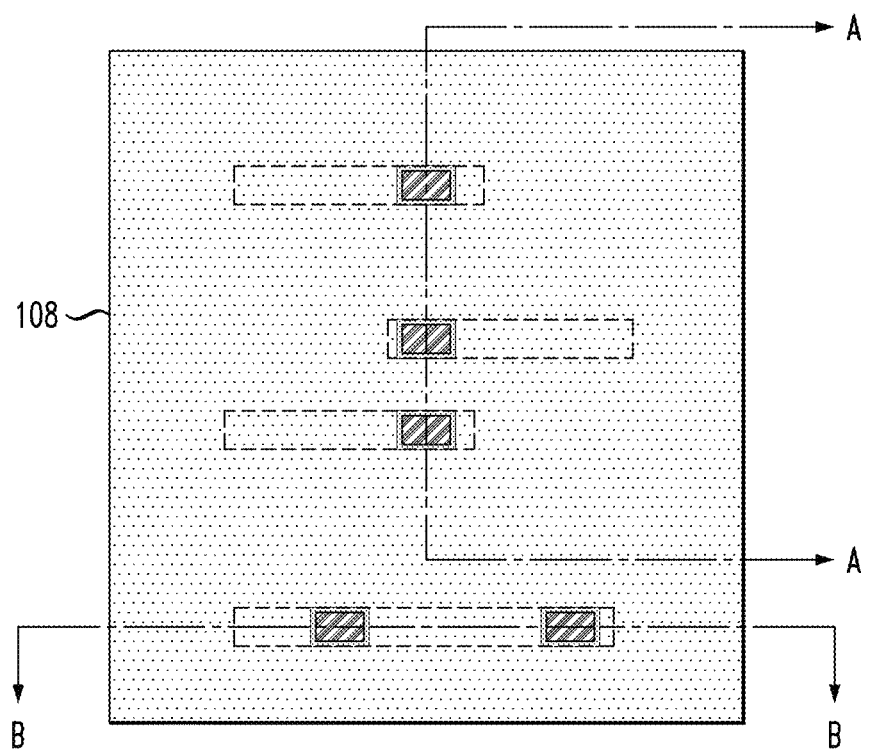
FIG. 7A depicts a top view of the FIG. 6A structure following removal of nitride and oxide layers, according to an embodiment of the invention.
Figure 7B:
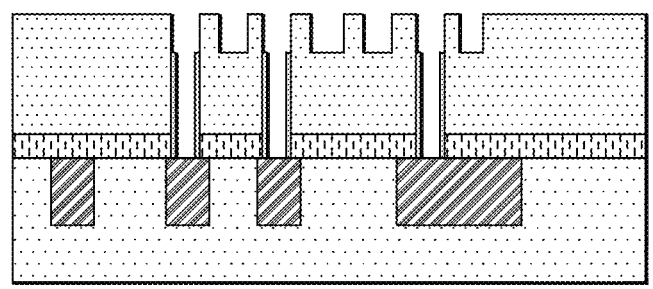
FIG. 7B depicts a first side cross-sectional view of the FIG. 7A structure, according to an embodiment of the invention.
Figure 7C:
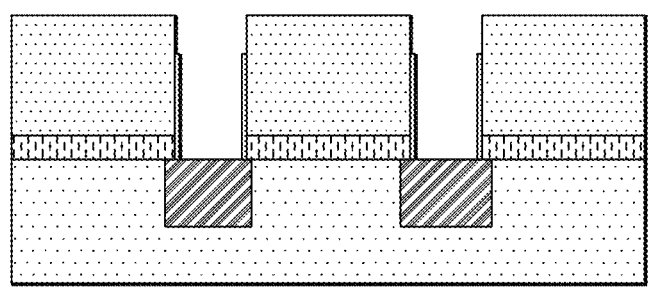
FIG. 7C depicts a second side cross-sectional view of the FIG. 7A structure, according to an embodiment of the invention.

FIG. 7A shows a top view 700 of the FIG. 6A structure following removal of the nitride layer 112 and oxide layer 110. FIG. 7B shows a side cross-sectional view 750 taken along the line A-A in FIG. 7A. FIG. 7C shows a side cross-sectional view 775 taken along the line B-B in FIG. 7A. The nitride layer 112 and oxide layer 110 may be removed using a wet or dry treatment or a combination of both. FIG. 7A also shows, in dashed outlines around the vias to contacts 104-1 and 104-2, desired trenches for interconnects in the structure as will be described in further detail below with respect to FIGS. 9A, 9B and 9C.

Figure 8A:
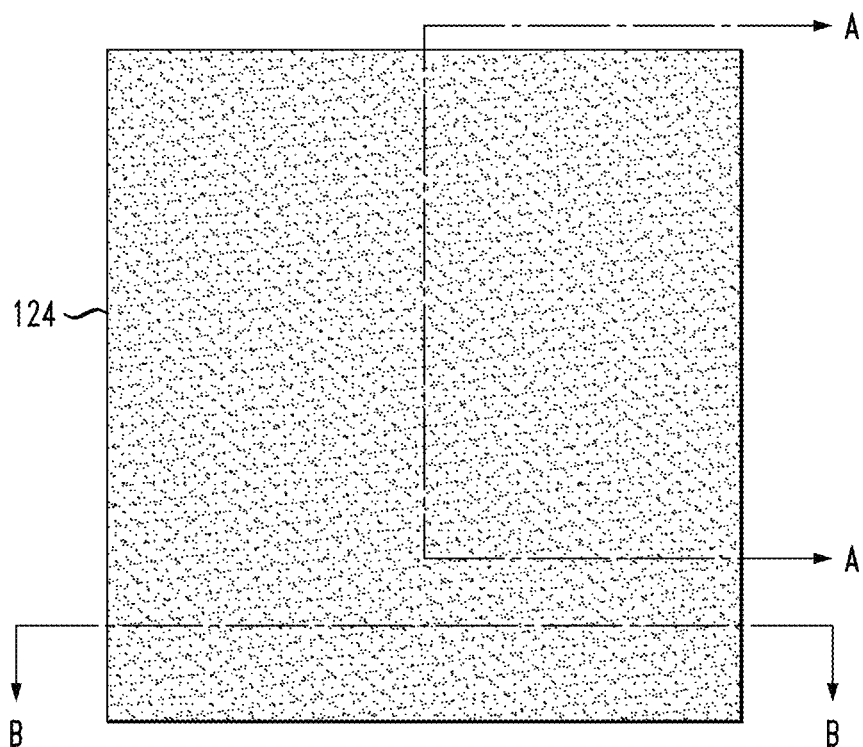
FIG. 8A depicts a top view of the FIG. 7A structure following formation of a metal layer, according to an embodiment of the invention.
Figure 8B:
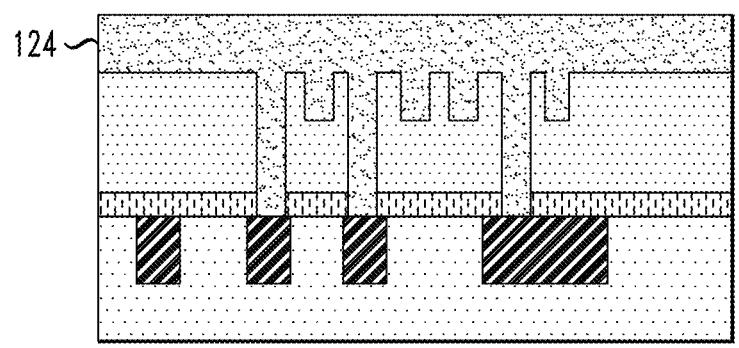
FIG. 8B depicts a first side cross-sectional view of the FIG. 8A structure, according to an embodiment of the invention.
Figure 8C:
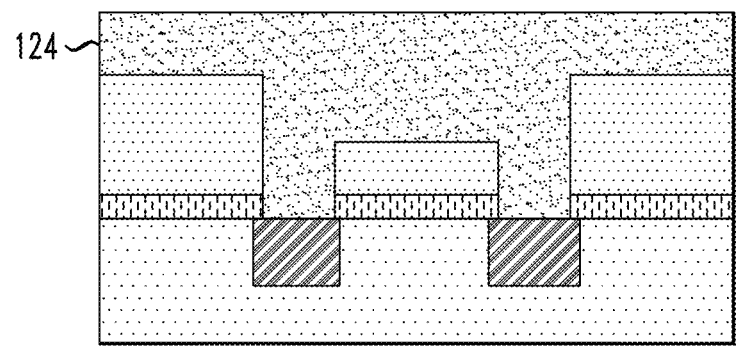
FIG. 8C depicts a second side cross-sectional view of the FIG. 8A structure, according to an embodiment of the invention.

FIG. 8A shows a top view 800 of the FIG. 7A structure following deposition of a metal layer 124 over the top of the structure. FIG. 8B shows a side cross-sectional view 850 taken along the line A-A in FIG. 8A. FIG. 8C shows a side cross-sectional view 875 taken along the line B-B in FIG. 8A. The metal layer 124 may be, for example, a first liner deposition such as TiN, TaN or Ru followed by a main metal such as W, Cu, Al or Ru in some embodiments. The metal layer 124 may be formed such that it fills the vias 320-1 and 320-2 as well as trenches 630-1 and 630-2 and forms a layer over the top surface of the entire structure as shown.

Figure 9A:
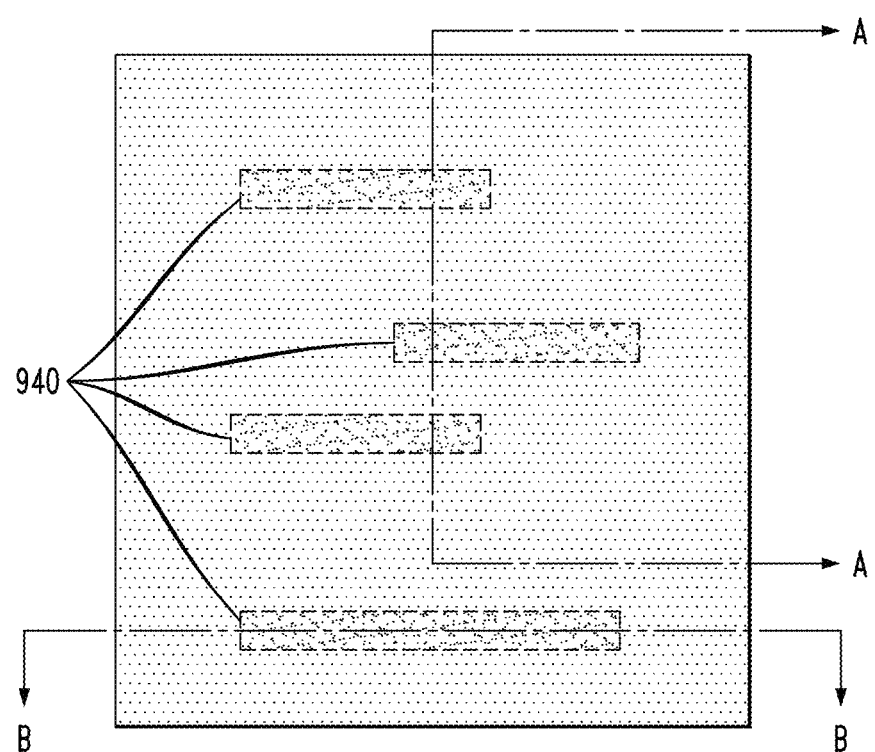
FIG. 9A depicts a top view of the FIG. 8A structure following planarization of the metal layer, according to an embodiment of the invention.
Figure 9B:
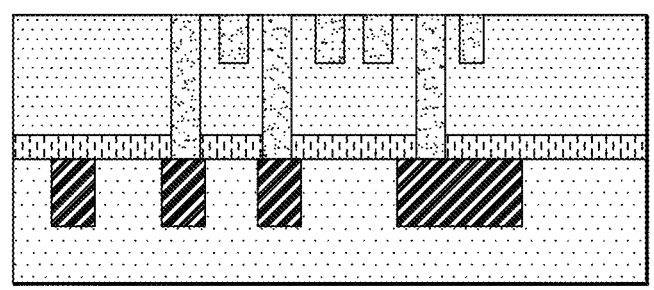
FIG. 9B depicts a first side cross-sectional view of the FIG. 9A structure, according to an embodiment of the invention.
Figure 9C:
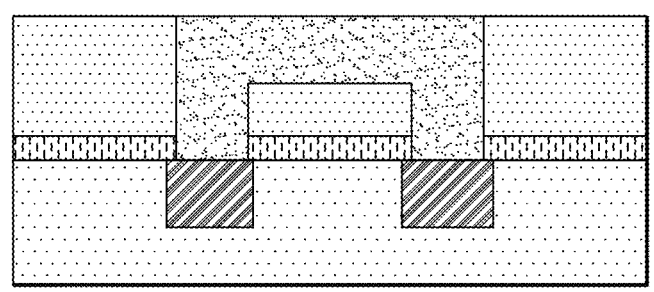
FIG. 9C depicts a second side cross-sectional view of the FIG. 9A structure, according to an embodiment of the invention.

FIG. 9A shows a top view 900 of the FIG. 8A structure following planarization of the metal layer 124. FIG. 9B shows a side cross-sectional view 950 taken along the line A-A in FIG. 9A. FIG. 9C shows a side cross-sectional view 975 taken along the line B-B in FIG. 9A. The planarization of the metal layer 124 may use CMP. As shown, after planarization of the metal layer 124 the portion thereof overfilling the top of the structure is removed such that the metal layer 124 remains only in the desired trenches 940 for interconnects. The trenches 630-1 are filled by metal layer 124 and provide on-level connections or interconnects in the resulting structure. The vias 320-1 and 320-2 provide connections to certain ones of the contacts 104-1 and 104-2, respectively, as shown. It is to be appreciated that the particular numbers, sizes and arrangements of vias, trenches and contacts shown in the figures are presented by way of example for purposes of illustration and that embodiments are not limited to the specific example shown. For example, more or fewer trenches and/or vias may be formed as needed for interconnects in a particular structure.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor structure, comprising:
    forming at least a first via in a multilayer structure comprising a first layer and a second layer formed over the first layer, wherein the first layer includes a first metal contact formed in the first layer, wherein a top surface of the first layer is coplanar with a top surface of the first metal contact, and the first via extending from a top of the second layer to the top surface of the first metal contact; and
    etching the top of the first metal contact with an etchant consisting of an argon gas etchant or a combination of an argon gas etchant and a helium gas etchant to form a polymer-oxide layer on at least a portion of the first metal contact and sidewalls of the first via, wherein the polymer-oxide layer formed on at least a portion of the sidewalls of the first via is derived from the argon gas interacting with the second layer.

2. The method of claim 1, wherein the etching comprises an in situ reactive ion etching.

3. The method of claim 1, wherein the etching utilizes a flow of argon gas exceeding 1200 standard cubic centimeters per minute.

4. The method of claim 1, wherein the etching utilizes a radio frequency powered magnetic field of at least 300 watts.

5. The method of claim 1, wherein forming at least one via in the multilayer structure comprises:
    forming the first via and at least a second via extending from the top of the second layer to a top of a second contact formed in the first layer;
    forming at least a first trench extending from the top of the second layer partially through the second layer, the first trench connecting the first via and the second via.

6. The method of claim 5, wherein the first via, the second via and the first trench form a chamfer having a high chamfering angle.

7. The method of claim 1, wherein the polymer film comprises an oxide layer.

8. The method of claim 1, wherein the first layer comprises a silicon substrate, the second layer comprises a dielectric layer and the first contact comprises a metal contact.

9. The method of claim 8, wherein the dielectric layer comprises an ultra low-K dielectric layer.

10. The method of claim 9, wherein the multilayer structure further comprises a third layer formed over the second layer, the third layer comprising an organic polymer layer.

11. The method of claim 10, wherein forming the first via in the multilayer structure comprises:
    forming an opening from a top surface of the third layer to a bottom surface of the third layer using a chemical etch and a resist mask; and
    forming the first via by etching the second layer through the opening formed in the third layer.

12. The method of claim 11, further comprising stripping the third layer from the multilayer structure following the cleaning process, wherein the polymer film protects channel dimensions of the first via during stripping of the third layer.

13. The method of claim 1, wherein the first layer comprises a silicon substrate, and the second layer comprises a dielectric layer.

14. The method of claim 13, wherein the dielectric layer comprises an ultra low-K dielectric layer.

15. The method of claim 1, wherein the multilayer structure further comprises a third layer formed over the second layer, wherein the third layer comprises an organic polymer layer.

16. The method of claim 15, wherein forming the first via in the multilayer structure comprises:
    forming an opening from a top surface of the third layer to a bottom surface of the third layer using a chemical etch and a resist mask; and
    forming the first via by etching the second layer through the opening formed in the third layer.

17. The method of claim 1, wherein the first layer comprises a silicon substrate.

18. The method of claim 1, wherein the first metal contact comprises one of W, Cu, and ruthenium.

19. The method of claim 1, wherein the combination of the argon gas etchant and the helium gas etchant includes 2 to 10% of helium gas.

* * * * *